(12) United States Patent
Kuijper et al.

(10) Patent No.: US 11,587,762 B2
(45) Date of Patent: Feb. 21, 2023

(54) DEVICE AND METHOD FOR DETERMINING A PROPERTY OF A SAMPLE THAT IS TO BE USED IN A CHARGED PARTICLE MICROSCOPE

(71) Applicant: FEI Company, Hillsboro, OR (US)

(72) Inventors: Maarten Kuijper, Eindhoven (NL); Matthijn Robert-Jan Vos, Eindhoven (NL); Ondrej Ludmil Shàněl, Brno (CZ); Peet Goedendorp, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/168,990

(22) Filed: Feb. 5, 2021

(65) Prior Publication Data
US 2021/0257183 A1    Aug. 19, 2021

(30) Foreign Application Priority Data
Feb. 19, 2020    (EP) .................................... 20158152

(51) Int. Cl.
| | | |
|---|---|---|
| *H01J 37/22* | (2006.01) | |
| *G01N 21/55* | (2014.01) | |
| *G01N 21/59* | (2006.01) | |
| *H01J 37/21* | (2006.01) | |
| *H01J 37/26* | (2006.01) | |

(52) U.S. Cl.
CPC ............ *H01J 37/228* (2013.01); *G01N 21/55* (2013.01); *G01N 21/59* (2013.01); *H01J 37/21* (2013.01); *H01J 37/26* (2013.01)

(58) Field of Classification Search
CPC . G01N 1/28; G01N 1/42; H01J 37/226; H01J 37/228; H01J 37/21; H01J 37/26
See application file for complete search history.

(56) References Cited

U.S. PATENT DOCUMENTS

| | | | | |
|---|---|---|---|---|
| 10,254,107 | B1 * | 4/2019 | Faville | ............... G01B 11/0641 |
| 10,770,265 | B1 * | 9/2020 | McQueen | ............... H01J 37/20 |
| 2010/0224781 | A1 * | 9/2010 | Hosokawa | ............ H01J 37/153 |
| | | | | 250/311 |

FOREIGN PATENT DOCUMENTS

| | | | | |
|---|---|---|---|---|
| EP | 3018467 | | 5/2016 | |
| EP | 3627138 | | 3/2020 | |
| EP | 3627138 | A1 * | 3/2020 | ............. G01B 11/06 |
| KR | 20070113678 | | 11/2007 | |
| WO | 2018/073242 | | 4/2018 | |
| WO | WO-2018073242 | A1 * | 4/2018 | ........... G01N 1/2813 |
| WO | 2019/010436 | | 1/2019 | |
| WO | WO-2019010436 | A1 * | 1/2019 | ............... G01N 1/36 |

* cited by examiner

*Primary Examiner* — David E Smith

(57) ABSTRACT

The invention relates to a device and method for determining a property of a sample that is to be used in a charged particle microscope. The sample comprises a specimen embedded within a matrix layer. The device comprises a light source arranged for directing a beam of light towards said sample, and a detector arranged for detecting light emitted from said sample in response to said beam of light being incident on said sample. Finally, the device comprises a controller that is connected to said detector and arranged for determining a property of said matrix layer based on signals received by said detector.

20 Claims, 4 Drawing Sheets

DEVICE AND METHOD FOR DETERMINING A PROPERTY OF A SAMPLE THAT IS TO BE USED IN A CHARGED PARTICLE MICROSCOPE

BACKGROUND OF THE INVENTION

The invention relates to a device and method for determining a property of a sample that is to be used in a charged particle microscope, said sample comprising a specimen embedded within a matrix layer, such as an aqueous or ice layer.

Biology is the natural science that studies life and living organisms, including their physical structure, chemical processes, molecular interactions, physiological mechanisms, development and evolution.

Cell biology is a branch of biology that studies the structure and function of the cell, the basic unit of life. Cell biology is concerned with the physiological properties, metabolic processes, signalling pathways, life cycle, chemical composition and interactions of the cell with their environment. In cell biology, molecular recognition between macromolecules governs all of the most sophisticated processes in cells. The most common macromolecules comprise biopolymers (nucleic acids, proteins, carbohydrates and lipids) and large non-polymeric molecules (such as lipids and macrocycles).

Many researchers are interested in studying macromolecular complexes in their natural environment at high resolution in order to reveal their structural dynamics and interactions. To this end, charged particle microscopy may be used. Charged particle microscopy is a well-known and increasingly important technique for imaging microscopic objects, particularly in the form of electron microscopy (EM). Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example.

EM provides a number of ways to study biological specimens: conventional TEM is used to study gross morphology of biological specimens; electron crystallography and single-particle analysis are dedicated to study proteins and macromolecular complexes; and (cryo-)electron tomography and Cryo-EM of vitreous sections (CEMOVIS) are aimed at cellular organelles and molecular architectures. In Cryo-EM and CEMOVIS, specimens are preserved by rapid freezing using a vitrification technique and observed by cryo-TEM. CEMOVIS additionally includes a cryo-sectioning step of the specimen, which may be done using a cryo-FIB technique.

For studying a specimen, a sample containing said specimen needs to be prepared. The sample may comprise a carrier, and a specimen embedded within a matrix layer, which may be a liquid or a solid, such as water or ice, is provided on said carrier.

Preparing a sample for study in charged particle microscope often is time consuming and labour intensive. One of the drawbacks associated with these studies is that only after the sample is prepared and studied in the charged particle microscope, the user knows whether the preparation of the sample was successful or not. This is especially true for preparing a biological sample, such as a Cryo-EM sample.

Preparing a Cryo-EM sample, for example, comprises the steps of taking an aqueous sample of a biological material (i.e. the "specimen", usually a purified protein complex), applying it to a support structure (grid), reducing its dimension, for example by means of a filter paper, to a layer that is as thin as possible (~100-800 Å, depending on the size of the biological molecule), and then freezing this layer fast enough to prevent the aqueous liquid from crystallising.

A device for preparing a Cryo-EM sample is known from WO 02/077612 A1, in name of applicant. This device is commercially available under the trade name "Vitrobot". The device described in WO 02/077612 A1 comprises an environmental chamber, a holder for a sample or a carrier, and at least one blotting element to which a medium for absorbing liquid is or can be attached, both disposed in the environmental chamber, and a cooling medium for cooling down said sample. The blotting element can be moved towards the sample or carrier in a controlled manner.

Many aspects of this process of preparing a biological sample are challenging. In this context, the step of reducing the dimension of the layer by removing excess liquid—which may be done by a technique called "blotting", for example—is considered to be decisive for the quality and the reproducibility of the liquid film.

Since the blotting step is difficult to establish in a reproducible way, US 2017/350798 A1 proposes a method and a device where the requirement for blotting of excess fluid may be minimized or eliminated by reducing the volume of the sample from microliter scale to picoliter scale.

In US 2010/181495 A1, a method and a device for preparing samples for a cryo-electron microscope are described. Here, a carrier is fixed to a holder, liquid containing the specimen is applied to the carrier, and a blotting device is used for removing excess liquid from the carrier. The blotting device comprises a filter paper that is brought into contact with the carrier. On opposite sides of the filter paper, a light source and optical sensor device are provided. The filter paper is illuminated with light and a change in the optical properties of the filter paper, due to the filter paper absorbing the excess liquid, is detected by means of said optical sensor device. A control unit moves the blotter away from the carrier depending on said change in the detected optical properties.

Even though the blotting step provides a challenge, many other aspects of the above process of preparing a biological sample are challenging and unpredictable as well. The purified complex may encounter microscopic surfaces, materials and dynamics that change said purified complex, or the sample may be contaminated during the process. With respect to the vitrification technique, it is observed that obtaining control of the resulting ice thickness and virtuosity of the ice is essential as well.

Preparing a cryo-EM sample with current preparation technology still results in a large variety of quality and therefore significant areas of the EM grid that cannot be used. Often, these changes are only visible once the sample on the grid has been examined in the Cryo-EM. Thus, valuable resources, including scientist preparation time and expensive EM use time, may be wasted to no avail. This is true for the preparation of other samples as well, and not limited to biological samples.

In view of this, it is an object of the invention to provide a device and method for determining a property of a sample to be used in a charged particle microscope, with which waste of valuable resources as described above can be prevented.

SUMMARY

To this end, the invention provides a device for determining a property of a sample to be used in a charged particle microscope, said sample comprising a specimen embedded within a matrix layer, wherein said device is defined according to claim 1. As defined herein, said device comprises: a light source arranged for directing a beam of light towards said sample; a detector arranged for detecting light emitted from said sample in response to said beam of light being incident on said sample; and a controller connected to said detector and arranged for determining a property of said matrix layer based on signals received by said detector.

By using a light source and directing it towards the sample directly, and detecting emitted light from the sample directly, it is possible to determine a property of said matrix layer in a direct way. It is noted that said matrix layer may be a liquid, such as a liquid that is used for preparing the sample. Said matrix layer may also be a solid, such as the vitrified liquid that is used for preparing the sample, or any other (semi-)transparent solid, such as a resin, for example. The light source may be chosen in such a way that it is affected by the matrix layer. The matrix layer may, for example, reflect, diffract, transmit, and/or absorb the light from the light source. By using the detector to detect the reflected, diffracted, transmitted and/or absorbed light, it is possible to distinguish samples based on different properties of said matrix layer. The distinguishing, or establishing of said property, may be qualitatively and/or quantitatively.

It is noted that in the present device, the light source is directed to the sample directly, and the detector is used for measuring light reflected by, or transmitted through, the sample directly. Hence, the present device provides a way for determining a property of the matrix layer in a direct way. This allows the device to be used at various sample stages. For example, it is possible to use the device during the preparation of the sample, such as during the blotting step as described before, wherein the matrix layer is an aqueous layer. In another embodiment, the device may be used after the vitrification of the sample, wherein the matrix layer is an icy layer. The matrix layer can in principle be any type of matrix layer that influences the emitted light by means of reflection, diffraction, transmission and/or absorption. In preferred embodiments, the matrix layer is an aqueous layer or an icy (vitreous) layer.

The light source may be directed to a surface of said sample, wherein said light source is arranged for emitting light in a first direction. Said detector may be arranged for receiving reflected and/or transmitted light from said sample, wherein the normal of said detector is directed in a second direction that is different from said first direction.

In an embodiment, said first direction is non-perpendicular with a normal of said sample.

In an embodiment, said second direction is non-perpendicular to said normal of said sample.

Preferred embodiments of the invention and advantages thereof will now be explained below.

In an embodiment, said device is arranged for collecting spatially resolved data. With this it is possible to locally determine said property of said matrix layer. For example, it is possible to map a 2D (x, y) coordinate system to the sample surface, and to assign a determined property of the matrix layer to one or more of the coordinates in said 2D coordinate system. In an embodiment, this may be used for establishing a map of the sample surface with corresponding properties of the matrix layer. This map provides a valuable insight to the user which sites may be used for further investigation of the sample, and which sites might be best avoided. It is noted that presently, for Cryo-EM samples, a Cryo-TEM is used in low magnification overview mode to assess the ice quality. This activity blocks the TEM for considerable time. By using the device as disclosed herein, the overview/map/atlas of the grid can be obtained in a rapid and efficient way, and this allows areas that are potentially good for data collection to be identified.

In an embodiment, said controller is arranged for evaluating said sample based on said determined property. This means that the controller may identify whether parts of the sample are approved or rejected based on the determined property of the matrix layer. For example, when it is determined that (a part of) the matrix layer contains a contamination, or that the matrix layer thickness is not as desired, the controller may indicate that the sample is not suitable for study. The controller may assign an evaluation to a respective 2D coordinate of the sample, or may assign an evaluation for the entire sample.

In an embodiment, said controller is arranged for determining at least one of a measure of thickness of said matrix layer, a measure of contamination of said matrix layer, a measure of virtuosity of said matrix layer. Said property may thus be said thickness and/or said measure of contamination. In case the matrix layer is vitrified (frozen), then the property may be the virtuosity (or state) of said vitrified matrix layer.

In an embodiment the device comprises at least one optical element, such as a lense. Said optical element may be positioned within a light path between said light source and said detector. Said optical element may be arranged for focussing and/or adjusting said beam of light. In an embodiment said optical element is arranged for focussing said beam of light onto said sample. In an embodiment said optical element is arranged focussing said beam of light onto said detector. It is conceivable that a plurality of optical elements are provided, each having one or more characteristics as described above.

The at least one optical element may be a colour selective filter. The colour selective filter may be positioned within a light path between said light source and said detector. The colour selective filter is arranged for passing a restricted band of wavelengths of light towards said detector. It is noted that said colour selective filter may comprise a plurality of colour selective filter elements, each arranged for passing a different restricted band of wavelengths of light towards said detector. The plurality of colour selective filter elements may be organized spatially over said detector, or may be an integral part of said detector. As an example, the detector may be selectively sensible for different bands of wavelengths by design, such as for example in the case an RGB pixel camera is used where different pixels are sensitive to different colours. Additionally, or alternatively, the plurality of colour selective filter elements may be positioned within the light path sequentially, i.e. one after another.

In an embodiment, said detector is arranged for receiving light transmitted through said sample. In an embodiment, said detector is arranged for receiving light reflected from said sample. It is noted that said detector may comprise a plurality of detector units, wherein one of the detector units is arranged for receiving light transmitted through said sample, and another one of the detector units is arranged for receiving light reflected from said sample. This provides additional sample information.

In an embodiment, said device comprises a scanning unit for applying a relative scanning motion of said beam of light on said sample. By using a relative scanning motion, it is possible to scan the sample with relatively high resolution, for example to establish the aforementioned 2D property map of the sample.

It is conceivable that said relative scanning motion is established by means of moving the sample past said light source, and/or moving said sample past said detector, using for example a sample stage.

Determining a property of the matrix layer, by means of a light source and a detector, can be realized in a multitude of ways. Below a variety of embodiments will be explained. It should be noted that these embodiments are not intended to be limited, and that combinations of these embodiments are conceivable as well.

In an embodiment, said light source comprises a laser source. A laser source is relatively cheap. The laser source is directed towards the sample surface, and in particular to the surface of the matrix layer. Said laser source may be arranged for projecting a line onto said sample. Said line may be scanned across the sample by using relative movement between the laser line and the sample. By using a line source, preferably in combination with a line sensor, it is possible to illuminate a relatively large part of the sample at once, while still retaining spatial information of the sample. By using a line scan the entire surface of the sample can be screened in a quick and easy way. This helps in establishing spatially resolved data on the property of the matrix layer. Additional advantage is that this setup does not require the use of relatively expensive 2D sensors.

It is conceivable, in particular in combination with the laser source, that the detector comprises a CMOS sensor. Said CMOS sensor can be a CMOS line-sensor, that can be used with the laser line source mentioned above. An aforementioned optical element may be used to focus transmitted light from said sample onto said CMOS detector. In an embodiment, said CMOS line-sensor comprises a CMOS 16$k$ line-sensor, running at a frame rate that is adapted to the relative movement between the sample and the light source and/or detector. The frame rate may be higher than 250 fps, preferably higher than 500 fps, more preferably higher than 1000 fps. Using this setup, it is possible to obtain a full matrix layer property map of a 3 mm grid within the 15 seconds.

In an embodiment, said light source comprises an LED. An LED is relatively cheap. Said light source may be arranged for directing a beam of multi-colored light towards said sample. This may be achieved in case the device comprises a multi-colored LED. In an alternative embodiment, said device comprises an LED that is arranged for generating a white LED illumination, in combination with one or more filter elements. In an embodiment, one or more filter elements may be provided. In particular, color filter elements for a total of three colours may be provided. These colors may be the primary colors red, green and blue, so that the sample can be illuminated with at least three different colors.

When the sample is illuminated with at least three different colors, theory of multi-beam interference from a parallel film may be used for obtaining the thickness of the matrix layer. This film interference happens because rays reflected at different layers have an interference due to the phase difference. A beam of light hitting a thin film (having a thickness d and a refractive index n) at an angle $\theta$ with respect to a normal of said film, has an optical path difference (OPD, or phase shift) that is equal to OPD=2 n d cos($\theta$). Now there are two very distinguishable cases: constructive interference and destructive interference. Destructive interference happens in case the phase difference is 180°, and constructive interference happens in case the phase difference is 0° or 360°. Since the 180° phase difference depends on the wavelength $\lambda$, destructive interference as a function of the OPD is then defined as 2 n d cos($\theta$)=$\lambda_i$, with m an integer. By introducing at least three different colors (different wavelengths) a system of equations is obtained, with which the thickness of the thin film can be determined. Similarly, the thickness of a multilayer system (i.e. a grid including a matrix layer on top) can be determined. It was found that this method is particularly useful for determining the thickness of a vitrified layer. In addition, the use of three colors is advantageous to determine whether contamination occurred in the sample.

In an embodiment said detector comprises a color camera. Said color camera may be arranged for receiving reflected light, in particular in combination with said LED. This combination is relatively cheap.

In an embodiment, said light source is arranged for producing an ellipsometer beam. In this embodiment the device is arranged for measuring a property of the matrix layer based on ellipsometry. With this, the change of polarization upon reflection or transmission of the light source on the sample can be measured and compared to a model. In view of (vitrified) biological samples, this is in particular useful for measuring the thickness and/or crystalline nature of the matrix layer. In this embodiment, use may be made of a polarizing element that is provided in between the light source and the sample. Further, a second polarizing element may be provided in between the sample and the detector. Optionally, one or more compensator elements may be provided in between the light source and the sample, and in between the sample and the detector. A suitable ellipsometry setup is known to those skilled in the art.

It is conceivable that the light source comprises a 3-color-LED. In combination with the above mentioned ellipsometer beam, it is possible to measure matrix layer thickness (in particular ice layer thickness) as well as scattering and/or transmission (which is a measure for contamination and/or crystalline nature). The ellipsometry setup may be based on reflection, such that the light source and the detector are arranged on the same side of the specimen. A combined scanning motion is conceivable as well. The spatial resolution may be retrieved by means of deconvolution.

In an embodiment, the light sources is arranged for producing light in the UV spectrum. Additionally or alternatively, the light source may be arranged for producing light in the IR spectrum. This embodiment is in particular advantageous for measuring the ice-virtuosity. In IR and UV the amorphous ice (which normally is considered to be the desired type of ice for biological samples in Cryo-EM) has different optical properties compared to the crystalline ice forms (which normally is considered to be the undesirable type of ice). In particular, the IR absorption coefficient and the refractive index differ between the two types of ice. Further, UV absorption is different for amorphous ice compared to cubic ice. Hence, the use of UV and/or IR light may be advantageously used to determine a property of the matrix layer, and in the present embodiment a quality of the matrix layer after vitrification.

According to an aspect, a sample preparation tool is provided, comprising a device as defined herein. Said sample preparation tool may be a Cryo-EM sample preparation tool, as described in WO 02/077612 A1, which is incorporated herein by reference. Said device may be arranged near said blotting element to monitor the blotting step during sample preparation. Said device may additionally, or alternatively, be arranged near said cooling medium to monitor the cooling (vitrification) of said sample.

According to an aspect, a charged particle microscope is provided, comprising a device as defined herein. Said device may be provided near a sample holder of said charged particle microscope. In particular, said sample holder may be movable between a loading position and an inspection position. Said device may be arranged in such a way that the sample, during movement between the loading position and the inspection position, passes said device and a property of said sample can be checked. For example, this allows the sample to be loaded and inspected by said device in such a way that a 2D map of the sample with corresponding properties of the matrix layer can be established. The results may be shown to the user, or otherwise stored, to aid in further processing of the sample.

In an embodiment, the sample comprises one or more pattern elements that are arranged to be detectable by the device as defined herein. Additionally, said one or more pattern elements may be arranged in such a way that they are detectable by said charged particle microscope as well. When using one or more pattern elements it is possible to accurately register the position of the sample, and an alignment in the charged particle microscope is possible as well without the need of going back to a low magnification.

According to an aspect, a method of determining a property of a sample that is to be used in a charged particle microscope is provided, as defined in claim 12. As defined herein, said method comprises the steps of: providing a sample comprising a specimen embedded within a matrix layer; directing a beam of light towards said sample; detecting light emitted from said sample in response to said beam of light being incident on said sample; and determining, using a controller, a property of said matrix layer based on said detected light.

Advantages of this method, and further embodiments thereof, have already been elucidated above. Summarized, by directly illuminating the sample with a beam of light, and using a detector for detecting light emitted from said sample, it is possible to determine a property of the matrix layer, such as thickness or contamination of the matrix layer. The determination of the property may be done qualitatively or quantitatively, and an evaluation of the sample may additionally take place.

The determined property may be a measure of thickness of said matrix layer and/or a measure of contamination of said matrix layer.

The method and device as disclosed herein may be used in an advantageous way during or after one or more of the following stages: a preparation step of preparing said sample; an application step of applying a matrix layer to said sample; a removal step of removing of an excess amount of a matrix layer from said sample; a vitrification step of vitrifying said sample with said matrix layer; and an imaging step of imaging said sample.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Figure 1:
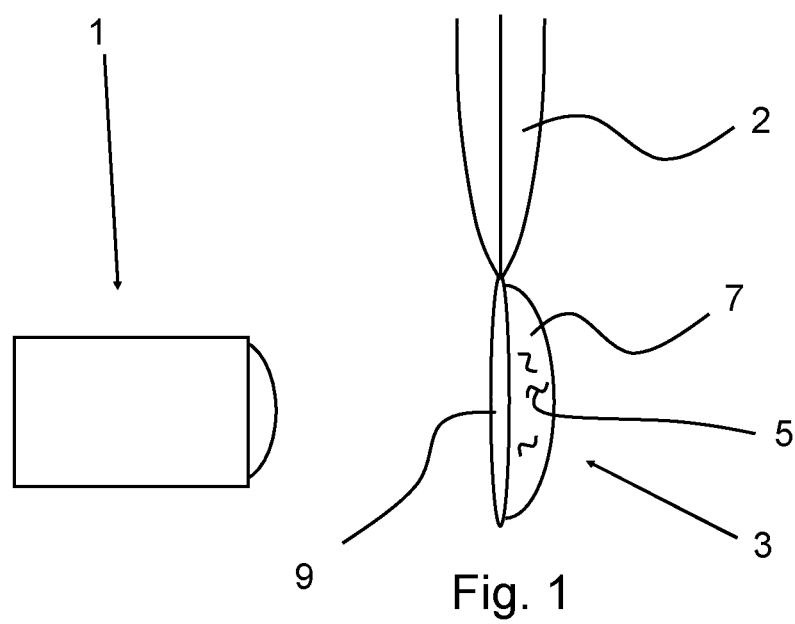
FIG. 1 shows a device for determining a property of a sample during a first use case.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Figure 2:
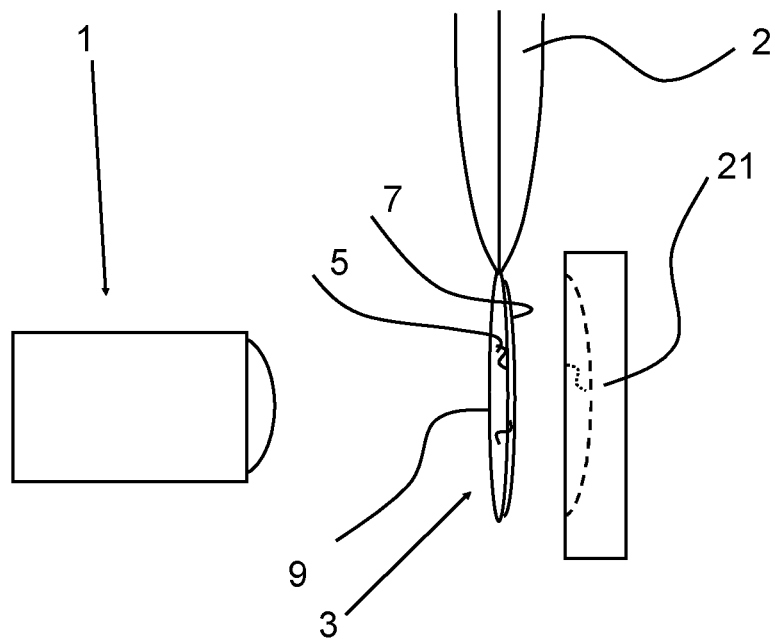
FIG. 2 shows a device for determining a property of a sample during a second use case.
Figure 3A:
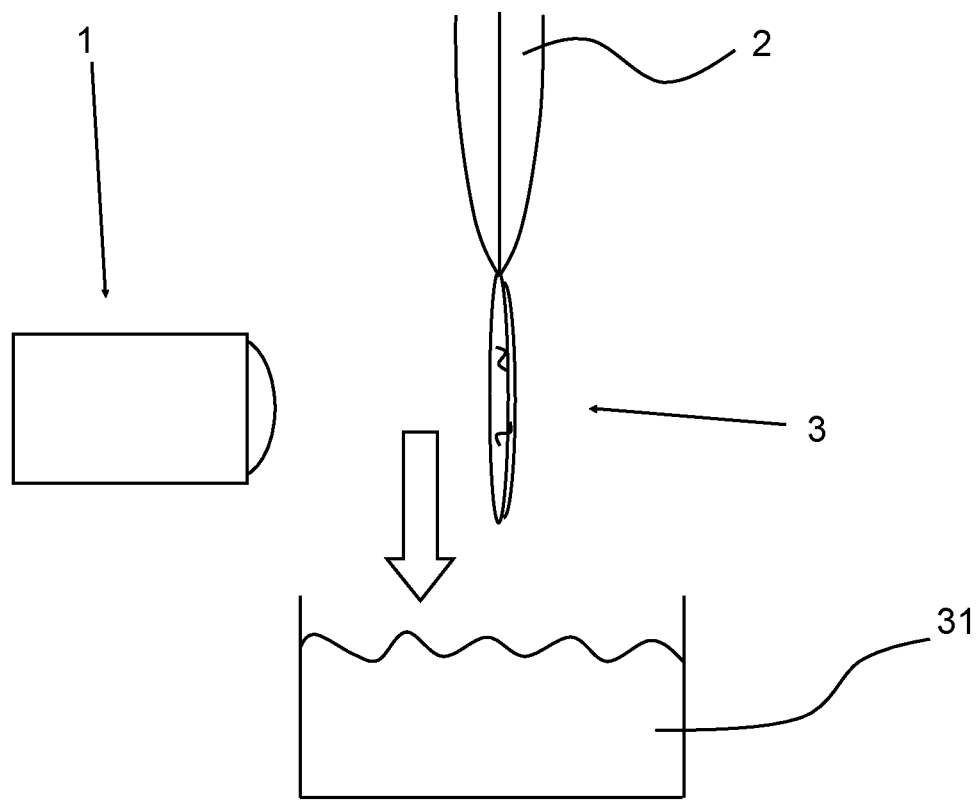
FIGS. 3a and 3b show a device for determining a property of a sample during a third use case.
Figure 3B:
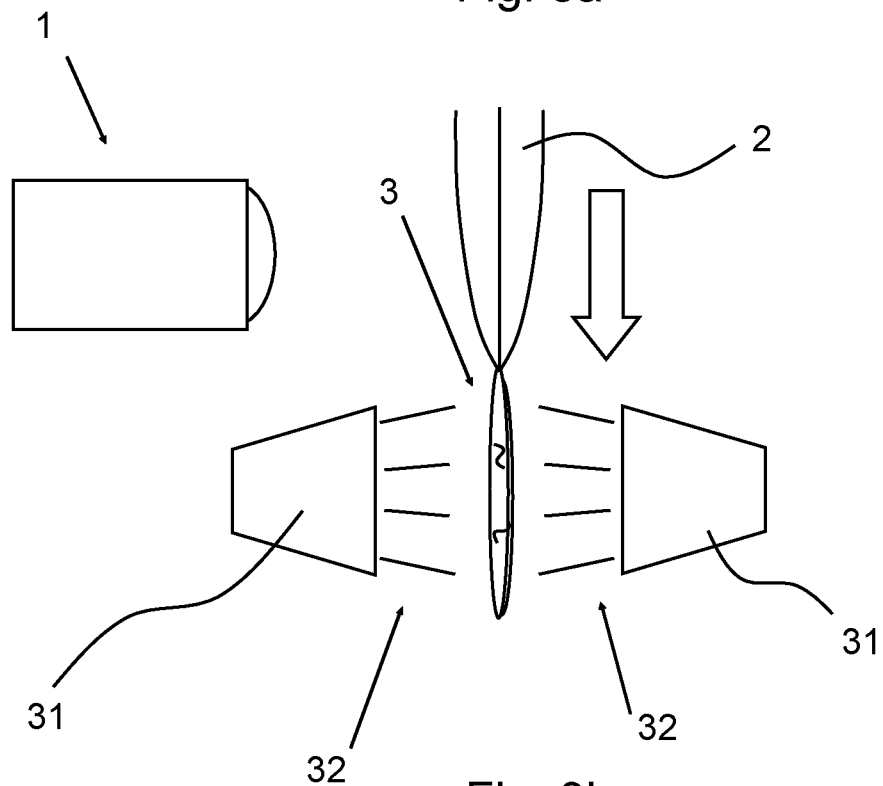
Figure 4:
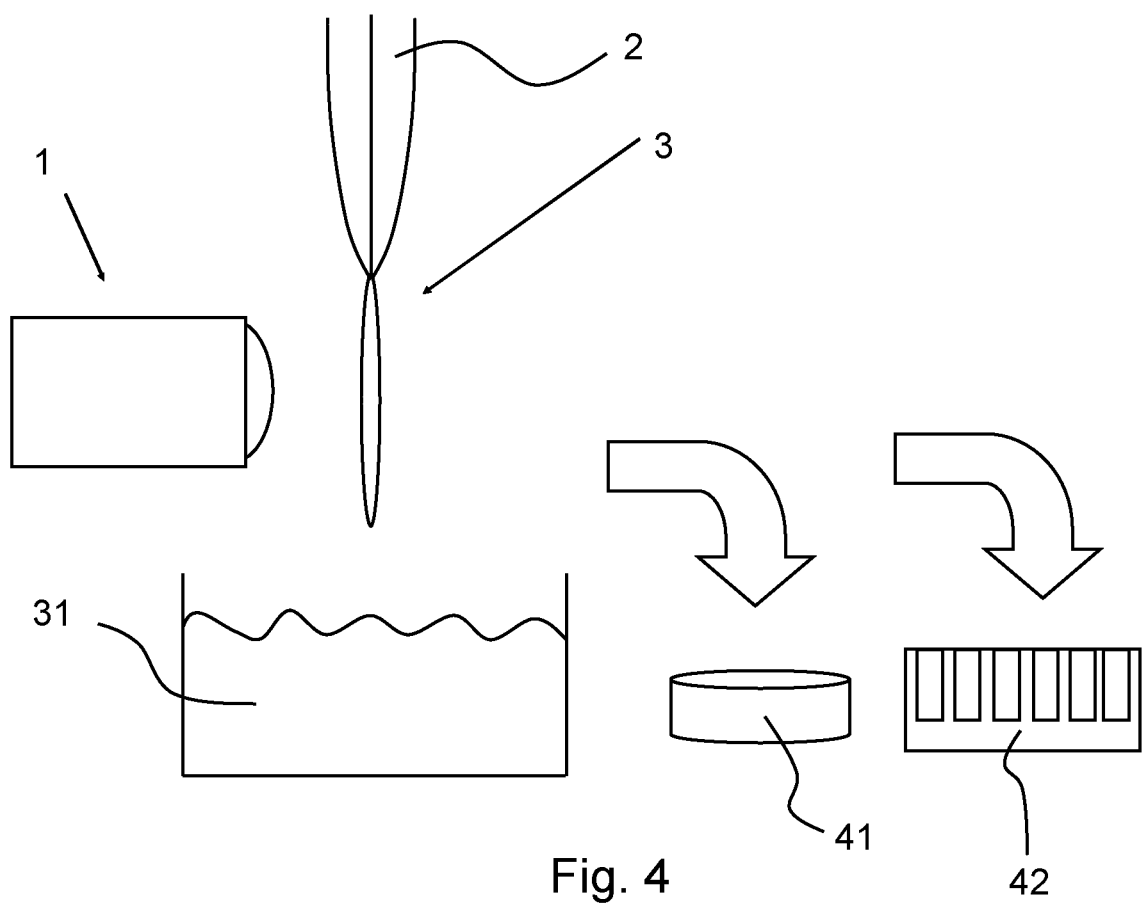
FIG. 4 shows a device for determining a property of a sample during a fourth use case.

FIGS. 1-4 show different stages of a method for preparing a biological sample 3 for use in a charged particle microscope, wherein use is made of a device 1 for determining a property of the sample 3 being prepared. In general, the method for preparing the biological sample 3 comprises the steps of: (a) Providing a sample carrier 9, and providing a specimen 5 of interest embedded within a liquid matrix layer 7 onto said sample carrier 9 for preparing a sample 3 (FIG. 1); (b) A blotting step for removing excess liquid from said matrix layer 7 by means of a blotting material 21, such as blotting paper (FIG. 2); (c) A vitrification step for vitrifying the liquid matrix layer, including the specimen 5 of interest, wherein use is made of a cryo-bath (FIG. 3a) or cryo-jets (FIG. 3b); and (d) A storage step for storing the vitrified sample 3 once vitrification has occurred (FIG. 4).

These general steps of preparing a cryo-EM sample are known to those skilled in the art and will not be explained in high detail. The device as disclosed herein can advantageously be used in sample preparation, and in particular in the cryo-EM sample preparation as described above. The device as disclosed herein can advantageously be used in each of the aforementioned sample preparation steps. It is noted that in these FIGS. 1-4 the device is schematically indicated. For these reasons, several embodiments of the device will be explained first with reference to FIGS. 5-7, and after that the use of the device in FIGS. 1-4 will be explained in more detail.

Figure 5:
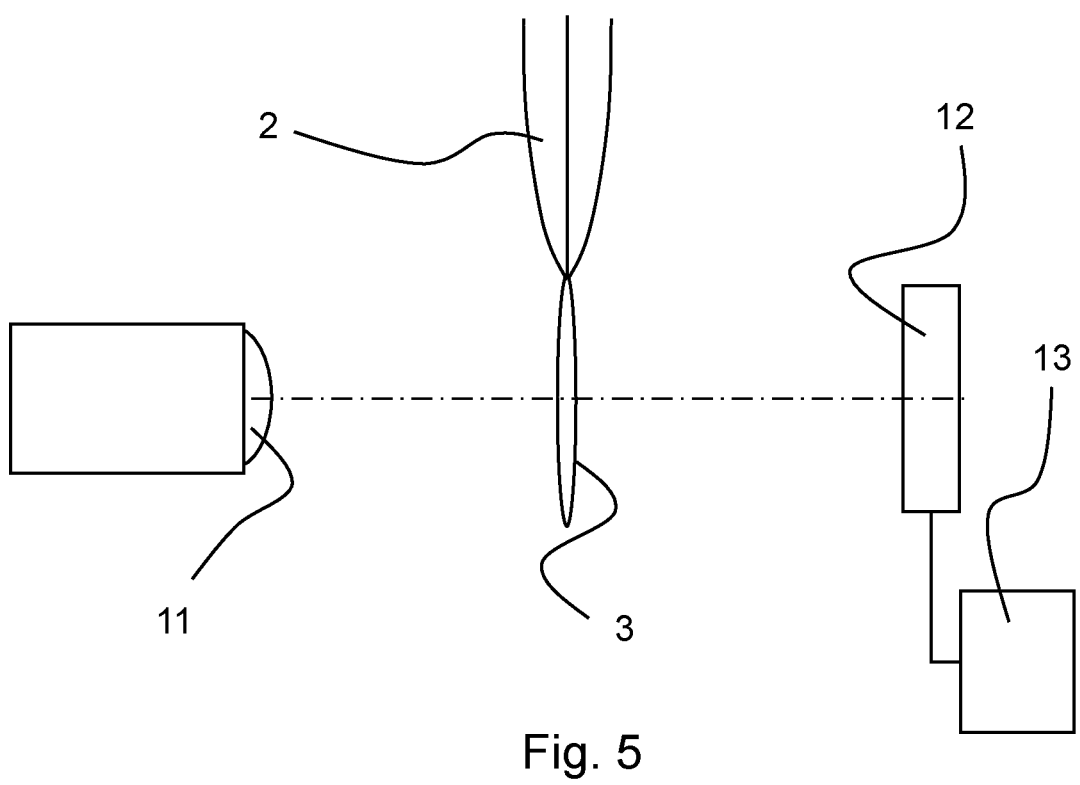
FIG. 5 shows a first embodiment of a device for determining a property of a sample.

Now turning to FIG. 5, a first embodiment of a device 1 for determining a property of a sample 3 that is to be used in charged particle microscope is shown. In the Figs. similar or corresponding features are indicated using the same reference numbers. The device shown comprises a light source 11 arranged for directing a beam of light towards said sample 3, a detector 12 arranged for detecting light emitted from said sample in response to said beam of light being incident on said sample 3; and a controller 13 connected to said detector 12 and arranged for determining a property of said matrix layer 7 based on signals received by said detector 12. In the embodiment shown, light emitted by said light source 11 is directed towards the sample 3, and the detector 12 is arranged on the opposite side of the sample 3. In other words, the device 1 is arranged in such a way that the sample can be located in between the light source 11 and the detector 12. Light falling on the sample 3 is scattered and/or absorbed, for example, and the detector 12 detects a certain amount of light depending on the amount of scattering and/or absorption. Thus, the detector 12 is arranged to receive light transmitted through the sample 3. With this it is possible to determine a property of the matrix layer of the sample 3, such as, for example, the presence of the matrix layer and/or a matrix layer thickness.

In the embodiment shown in FIG. 5, the light source 11 can be a laser, or an LED. The detector is arranged for detecting light emitted from the light source 11 and is thus correspondingly arranged for receiving laser light and/or LED light. The detector may be a CMOS sensor (in particular in combination with a laser) or a color camera (in particular in combination with an LED) as described previously. Other light sources are conceivable as well.

In the embodiment shown in FIG. 5, the light source 11 is directed to the sample 3. The light beam can be directed to a single, relatively small spot of the sample 3. The light beam can be directed to a plurality of spots on the sample 3. Alternatively, the light beam can be directed to a single, relatively larger spot on the sample 3. It is conceivable that the light beam is arranged for illuminating the sample 3 with a line pattern. This allows a larger part of the sample 3 to be illuminated, and simultaneously be detected by a suitable detector. It is conceivable that a scanning unit (20, not shown in FIG. 5) is provided that is arranged for establishing a relative movement between the sample 3 and the light source 11. This way, the light beam, which can be a spot or a line, can be scanned over the sample 3, in order to collect spatially resolved data. This means that a 2D map of the sample and the respective property of the matrix layer can be obtained which is useful for further evaluation of the sample.

It is noted that the controller 13 may be arranged for evaluating the sample 3 based on the determined property. The evaluation may take place based on the aforementioned spatially resolved data. Evaluation may also take place on a plurality of properties as well.

As an example, the determined property of the matrix layer may be one or more of a measure of thickness of the matrix layer and a measure of contamination of the matrix layer. For example, a measure of the thickness of the matrix layer includes the determination of the total thickness of the sample 3, including the matrix layer 7 and the sample carrier 9. The measure of the thickness may be qualitatively (e.g. pass or no-pass) or quantitatively (e.g. 150 nm). In other words it is conceivable that the device is arranged for determining thicknesses of the matrix layer (with or without the sample carrier 9) over a predetermined value range and with a predetermined accuracy. In an embodiment, the device is arranged for detecting and determining a thickness in the range of 0-1000 nm, more specifically in the range of 0-400 nm.

Figure 6:
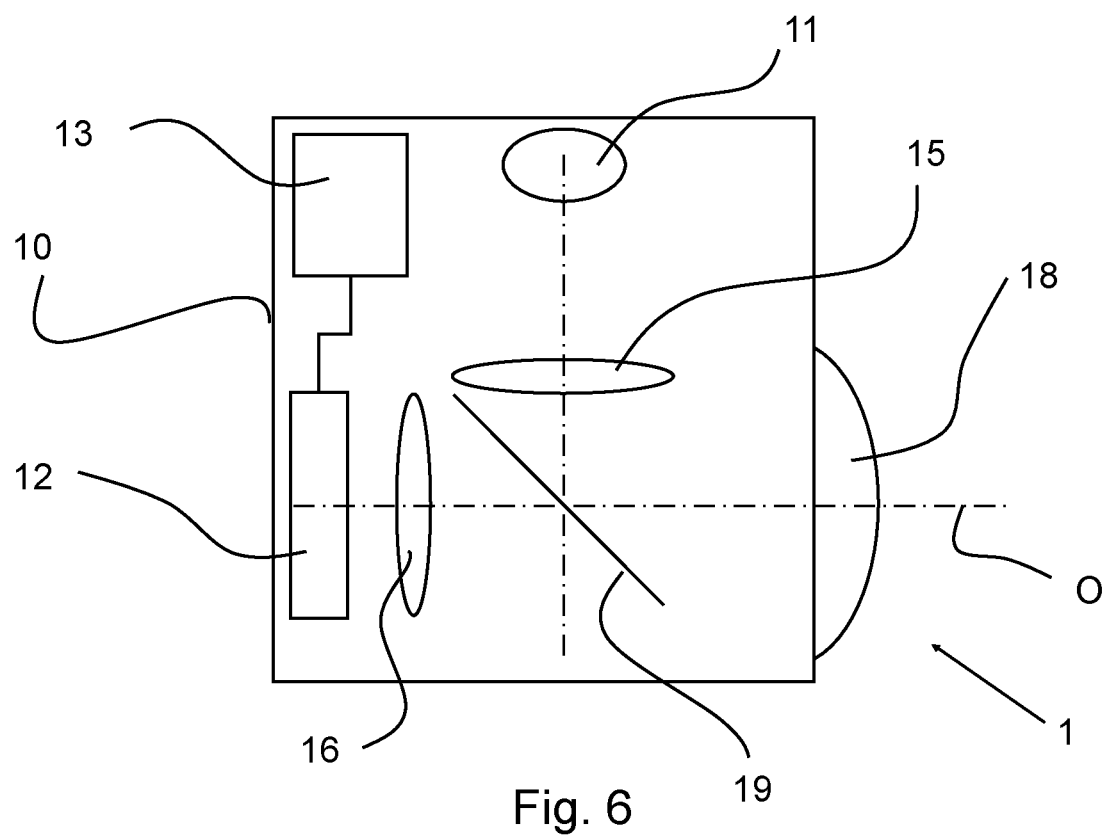
FIG. 6 shows a second embodiment of a device for determining a property of a sample.

FIG. 6 shows a second embodiment of the device 1 as disclosed herein. The device 1 comprises a housing 10, in which a light source 11 and a detector 12 are provided. A semi-transparent mirror 19 is positioned in between the light source 11 and the detector 12, and aligned with optical axis O in such a way that light transmitted from the light source 11 is emitted along optical axis O, and light reflected by the sample is emitted back along optical axis O towards the detector 12. An optical element 15 is provided downstream of the light source 11. In the embodiment shown, the light source is a white LED, and the optical element 15 is a lens element. Additionally, a final lens 18 is provided. The optical element 15 and the final lens 18 are arranged for focusing the white LED light onto the specimen with a substantially non-parallel (but almost parallel) beam. In other words, the beam of light emitted from the final lens 18 is slightly converging onto the sample. Using a slightly unparalleled beam increases the amount of reflected light towards the device 1, and increases the signal received by the detector, in particular when the sample surface is non-perpendicular to the optical axis O. The optical element 15 may, for example, be a plano-convex lens with a focal length of 60 mm.

The device 1 shown in FIG. 6 comprises a further optical element 16 that is positioned in between the detector 12 and the semi-transparent mirror 19. The further optical element 16 is an achromatic lens element.

The device 1 as shown in FIG. 6 is thus arranged in such a way that an ellipsometer beam is produced. Ellipsometry is an optical technique for investigating the dielectric properties (complex refractive index or dielectric function) of thin films. Ellipsometry measures the change of polarization upon reflection or transmission and compares it to a model. Ellipsometry can be used to characterize composition, roughness, thickness (depth), crystalline nature, doping concentration (in semiconductor samples), electrical conductivity and other material properties. It is very sensitive to the change in the optical response of incident radiation that interacts with the material being investigated. Hence an ellipsometer beam provides advantages for use in investigating a property of a matrix layer of a specimen that is to be studied in charged particle microscopy, where samples are typically small.

In particular, a combination of creating spatially resolved data with achromatic ellipsometry allows a special condition of the sample to be distinguished, one that was previously not possible to detect. This special condition is so-called back-side wetting of the sample. It was found that using a simple optical model based on interference, and using 3 colors, the absolute thickness of the sample (i.e. sample holder 9 and matrix layer 7) can be determined. However, it is not possible to see the exact position of the several layers contributing to the interference. To this end, it is possible, in an embodiment, to use an optical model based on interference and diffraction in which the diffracted orders are caused by the light propagation through the supporting structure having a repetitive pattern of features, like holes in a regular array, and with this it is possible to determine the absolute thickness of the total sample as well as the location of the matrix layer (i.e. front side, back-side, and/or combinations thereof). It is noted that when detecting a first or higher order diffracted beam it is advantageous to illuminate the sample under an angle such that the diffracted order propagates to the detector perpendicular from the sample plane. It is noted that for certain combinations of detected light, there are multiple solutions as to the thickness of the sample. In that case, it is possible to use the spatially resolved data to come to a conclusion of the thickness, as the thickness of the matrix layer is, in principle, continuous over at least part of the surface of the sample holder 9.

Figure 7:
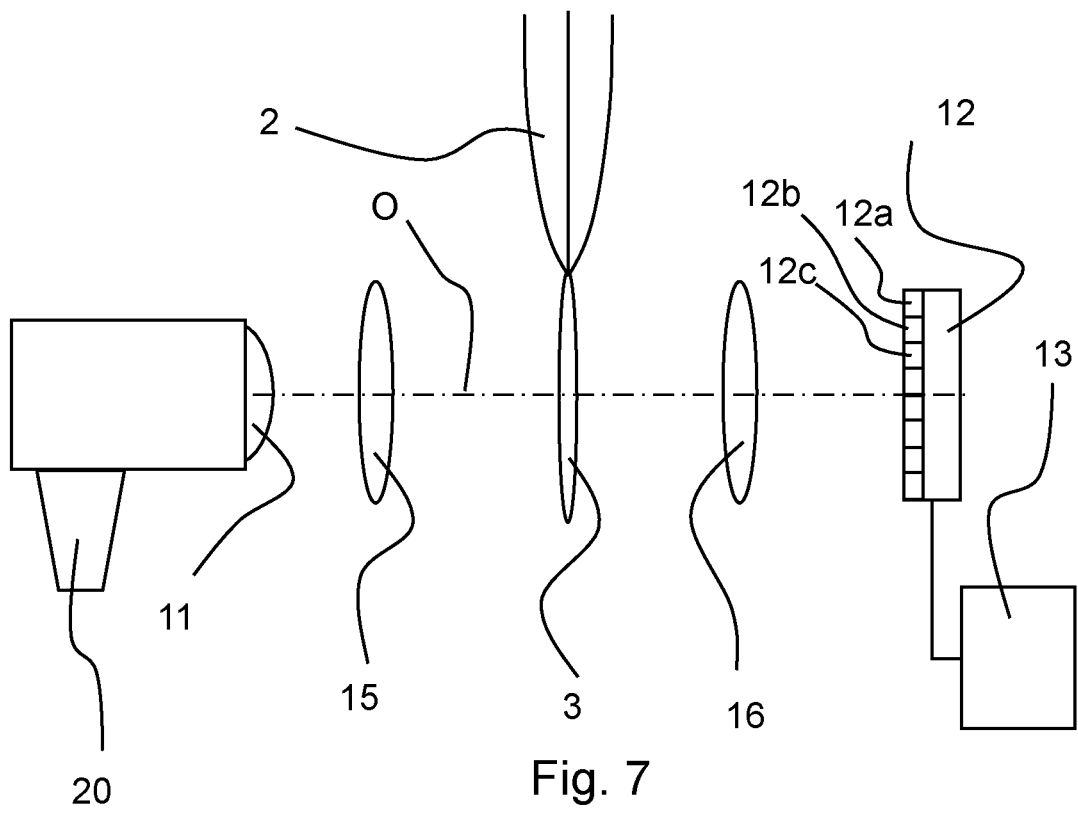
FIG. 7 shows a third embodiment of a device for determining a property of a sample.

In FIG. 7, another embodiment of the device 1 is shown. In this embodiment, the light source 11 is provided on one side of the sample 3, and the detector 12 is positioned on the opposite side of the sample 3. The sample is thus placed in between the light source 11 and the detector 12. The light source 11 and the detector 12 are substantially placed in line with the optical axis O. One or more optical elements 15, 16 such as lens elements and/or filter elements may be provided in between the light source 11 and the sample 3, and/or in between the sample 3 and the detector 12. The detector 12 comprises a number of different pixels 12a-12c, wherein pixels 12a are sensitive to a first band of wavelength of light, pixels 12b are sensitive to a second band of wavelength of light, and pixels 12c are sensitive to a third band of wavelength of light. As shown, the detector 12 comprises a multitude of different pixels 12a-12c, and for reasons of conciseness only three pixels are indicated using the reference signs 12a-12c. The detector 12 may be an RGB pixel camera, wherein pixels 12a are sensitive to red, pixels 12b are sensitive to green, and pixels 12c are sensitive to blue. It is conceivable that a plurality of detectors is used to obtain the same, or similar, technical effect. The detector 12 (or detectors) may be connected to a control unit 13, and based upon the signals received by the detector 12, the control unit is able to determine a property of the matrix layer of the sample 3. In this embodiment, the light source 11 is provided with scanning means 20 in such a way that the light beam may be moved relative with respect to the sample 3. This allows a 2D matrix layer property map of the sample 3 to be generated.

Now turning back to FIGS. 1-4, several use cases of the device 1 will be explained. It is noted that in principle any one of the embodiments of the device as shown in FIG. 5-7 may be used. In particular the use of the embodiment shown in FIG. 6 is advantageous, as it only requires access to one side of the sample.

In FIG. 1 the device 1 is used during a preparation step of preparing said sample. In the case shown, the device 1 is used during an application step of applying a matrix layer to said sample 3. Here a liquid matrix layer 7 containing the specimen 5 to be studied is applied to the sample holder 9. The sample holder 9 may be a sample grid, which are known to those skilled in the art, and may comprise a small (several millimeters) copper disc that comprises a fine mesh with a carbon foil on top. The liquid matrix layer 7 is applied to one side of the sample grid 9 and the device 1 may be used to check the successful application of the liquid matrix layer, i.e. by sensing an increase in thickness or a change in optical properties of the object being studied.

In FIG. 2 the device 1 is used in a removal step of removing of an excess amount of a matrix layer 7 from said sample. Here, a blotting filter 21 is used and lightly pressed against the sample 3 to allow excess fluid from the matrix layer 7 to be absorbed by the blotting paper 21. This allows a relatively small layer 7 containing the specimen 5 to be studied to be remaining on the sample holder 9. The device 1 may be used during the blotting step, and/or after the blotting step, to see that blotting is successfully applied. If the blotting was not successful, a further attempt may be performed. If the blotting removed too much material, it can be decided to either discard the present grid, or to reapply fresh liquid to the same grid.

In FIG. 3a, the device 1 is positioned slightly above a liquid nitrogen bath 31. The sample 3 may be vitrified in this bath 31, and once removed from the bath, the device 1 may be used to check the quality of the obtained sample 3. For example, ice thickness, contamination, and/or crystalline nature of the vitrified matrix layer may be investigated. In FIG. 3b, the device is used in a similar way, with the difference that two opposing ethane jets are used in the vitrifying process. In this sense it is noted that the nature of method of vitrifying the sample is not limited to the use of the device 1 as disclosed herein. The device 1 may advantageously be used to investigate one or more properties of the matrix layer after a vitrification step.

In FIG. 4, it is schematically shown that the sample 3, once vitrified, may be stored. Options for storing include a storage box 41 or cassette, or a bath storage 42 filled with liquid nitrogen or the like. The device 1 may be used to check the quality of the sample 3 before or after storage. Generally, however, it is sufficient to check the quality right after vitrification, and evaluate the sample based on the results obtained.

From the above it follows that the device 1 may thus be advantageously used at different positions in a sample preparation tool, such as the one disclosed in WO 02/077612 A1, which document is included herein by reference.

Additionally, the device as disclosed herein may advantageously be used in a charged particle microscope, such as an Cryo-EM. In particular, the device may be positioned near a sample holder and/or sample loader of the cryo-EM. When inserting a sample to be studied into the charged particle microscope, the device as disclosed herein can check—quantitatively or qualitatively—whether the sample is suitable for use in the charged particle microscope. Additionally, it is possible to generate a 2D map of relevant parts of the sample. This allows a sample to be studied more quickly and more effectively.

The desired protection is determined by the appended claims.

The invention claimed is:

1. A device for determining a property of a sample, said sample comprising a specimen embedded within a matrix layer, wherein said device comprises:
   a light source arranged for directing a beam of light towards said sample, said sample comprising a specimen embedded within a matrix layer, and wherein the beam of light comprises a first beam of a first color, a second beam of a second color, and a third beam of a third color;
   a detector arranged for detecting light emitted from said sample in response to said beam of light being incident on said sample; and
   a controller connected to said detector and arranged for determining a property of said matrix layer based on a multi beam interference pattern between the first beam, the second beam, and the third beam shown in signals received by said detector.

2. The device of claim 1, wherein the device is arranged for collecting spatially resolved data.

3. The device of claim 1, wherein said controller is arranged for determining at least one of:
   a measure of thickness of said matrix layer; and
   a measure of contamination of said matrix layer.

4. The device of claim 1, wherein said detector is arranged for receiving light transmitted through said sample.

5. The device of claim 1, wherein said detector is arranged for receiving light reflected from said sample.

6. The device of claim 1, wherein said device comprises a scanning unit for applying a relative scanning motion of said beam of light on said sample.

7. The device of claim 1, wherein said light source comprises a laser source, and wherein said detector comprises a CMOS line sensor.

8. The device of claim 1, wherein said light source comprises an LED configured to emit the first beam of the first color, the second beam of a second color, and the third beam of a third color, and wherein said detector comprises a color camera.

9. The device of claim 1, wherein said light source is arranged for producing an ellipsometer beam.

10. The device of claim 1, further comprising one or more color filter elements configured to filter the beam of light such that it only contains the first beam of a first color, the second beam of a second color, and the third beam of a third color.

11. Charged particle microscope system for investigating a sample, the system comprising:
   a sample holder configured to hold the sample, wherein the sample comprises a specimen embedded within a matrix layer;
   a charged particle source configured to emit a charged particle beam towards the sample;
   a focusing column configured to direct the charged particle beam to the sample;
   a device for determining a property of the sample, wherein the device comprises:
      a light source arranged for directing a beam of light towards the sample, wherein the beam of light comprises a first beam of a first color, a second beam of a second color, and a third beam of a third color; and
      a detector arranged for detecting light emitted from the sample in response to the beam of light being incident on the sample; and
      a controller connected to the detector of the device, wherein the controller is configured to determine a property of the matrix layer of the sample based on a multi beam interference pattern between the first beam, the second beam, and the third beam shown in signals received by the detector of the device.

12. The system of claim 11, wherein said controller is configured to determine at least one of:
   a measure of thickness of the matrix layer; and
   a measure of contamination of the matrix layer.

13. The system of claim 11, wherein the device is arranged for collecting spatially resolved data.

14. The system of claim 11, wherein said controller is arranged for evaluating said sample based on said determined property.

15. The system of claim 11, wherein said detector is arranged for receiving light transmitted through said sample.

16. The system of claim 11, wherein said detector is arranged for receiving light reflected from said sample.

17. The system of claim 11, wherein said device comprises a scanning unit for applying a relative scanning motion of said beam of light on said sample.

18. A method of determining a property of a sample, said method comprising the steps of:
   providing a sample comprising a specimen embedded within a matrix layer;
   directing a beam of light towards said sample, wherein the beam of light comprises a first beam of a first color, a second beam of a second color, and a third beam of a third color;
   detecting light emitted from said sample in response to said beam of light being incident on said sample; and
   determining, using a controller, a property of said matrix layer based on a multi beam interference pattern between the first beam, the second beam, and the third beam shown in said detected light.

19. The method of claim 18, comprising the step of determining at least one of:
   a measure of thickness of said matrix layer; and
   a measure of contamination of said matrix layer.

20. The method of claim 18, comprising the step of rejecting and/or approving said sample before, during or after one or more of the following stages:
   a preparation step of preparing said sample;
   an application step of applying a matrix layer to said sample;
   a removal step of removing of an excess amount of a matrix layer from said sample;
   a vitrification step of vitrifying said sample; and
   an imaging step of imaging said sample.

* * * * *